United States Patent [19]

Sheen

[11] Patent Number: 5,057,991

[45] Date of Patent: Oct. 15, 1991

[54] STRUCTURE OF BRIDGE RECTIFIER

[75] Inventor: C. G. Sheen, Taipei, Taiwan

[73] Assignee: Silitek Corporation, Taipei, Taiwan

[21] Appl. No.: 645,444

[22] Filed: Jan. 24, 1991

[51] Int. Cl.[5] ............................................. H02M 7/06
[52] U.S. Cl. ..................................... 363/144; 29/854;
357/76; 363/126; 437/209
[58] Field of Search ....................... 363/126, 144, 146;
357/76, 77; 437/906, 209; 29/854

[56]  References Cited

U.S. PATENT DOCUMENTS

| | | | |
|---|---|---|---|
| 3,476,985 | 11/1969 | Magner et al. | 357/76 |
| 4,367,523 | 1/1983 | Urba | 363/144 |
| 4,724,474 | 2/1988 | Duchek et al. | 357/76 |

FOREIGN PATENT DOCUMENTS 1246888  8/1967  Fed. Rep. of Germany ........ 357/76

Primary Examiner—William H. Beha, Jr.
Attorney, Agent, or Firm—Lowe, Price, LeBlanc & Becker

[57]  ABSTRACT

A bridge rectifier, comprising a first pair of silicon chips connected between a first outer lead and two inner leads, a second pair of silicon chips connected between said two inner leads and a second outer lead, and a pair of conductive blocks connected between said two inner leads and said second pair of silicon chips. The positive (negative) pole of the silicon chips is disposed at the same direction with one another so that the silicon chips can be mounted in a mold through an automatic silicon mounting device.

1 Claim, 3 Drawing Sheets

STRUCTURE OF BRIDGE RECTIFIER

BACKGROUND OF THE INVENTION

The present invention relates to bridge rectifiers, and more particularly relates to a bridge rectifier which can be conveniently assembled through an automatic machine.

FIG. 1 illustrates a structure of bridge rectifier according to the prior art which is assembled by placing two outer leads transversely at the same level, then, connecting the positive end of a first pair of silicon chips to the top edge of the first outer lead and the negative end of a second pair of silicon chips to the top edge of the second outer lead, and then connecting two inner leads longitudinally to the silicon chips at the top permitting each inner lead to connect with the positive pole of one silicon chip and the negative pole of another silicon chip. Disadvantage of this structure is that the positive and negative poles of one silicon chips are disposed at different directions from another. Therefore, this arrangement is not suitable for automatic production through an automatic silicon chip mounting device, i.e. the silicon chips are respectively mounted in place inside the mold by labor.

SUMMARY OF THE INVENTION

The present invention has been accomplished to eliminate the aforesaid problem. It is therefore an object of the present invention to provide a bridge rectifier which can be assembled through automatic manufacturing process. This object is achieved by mounting a first pair of silicon chips between a first outer lead and two inner leads, a second pair of silicon chips between said two inner leads and a second outer lead, and a pair of conductive blocks between said two inner leads and said second pair of silicon chips. Therefore, the silicon chips are all disposed in a vertical position with the positive pole commonly facing downward and the negative pole commonly disposed upward.

DETAILED DESCRIPTION OF THE PREFERRED EMBODIMENT

Figure 1:
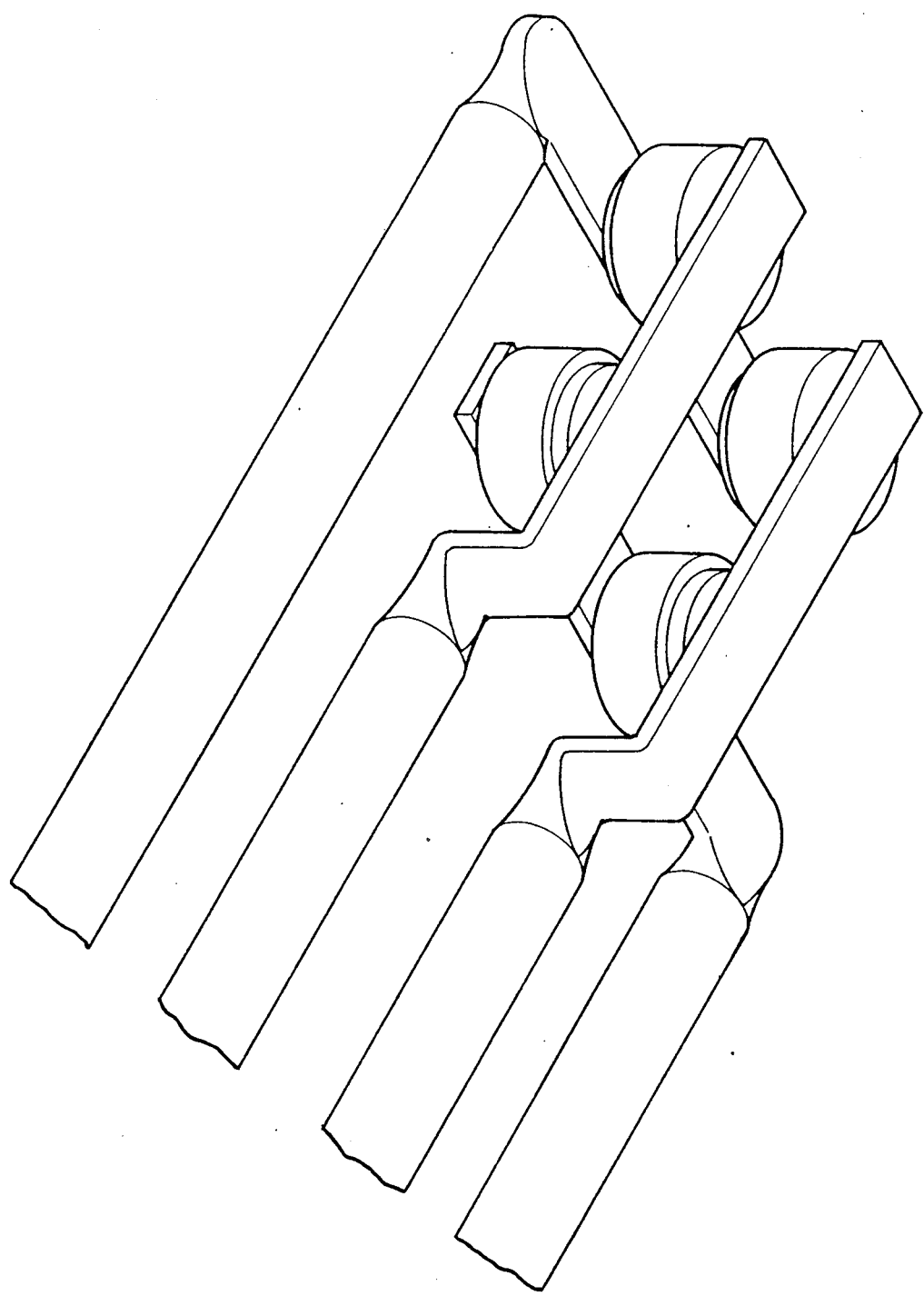
FIG. 1 illustrates a structure of bridge rectifier according to the prior art, showing that the silicon chips and the leads thereof are arranged into a bridge circuit.
Figure 2:
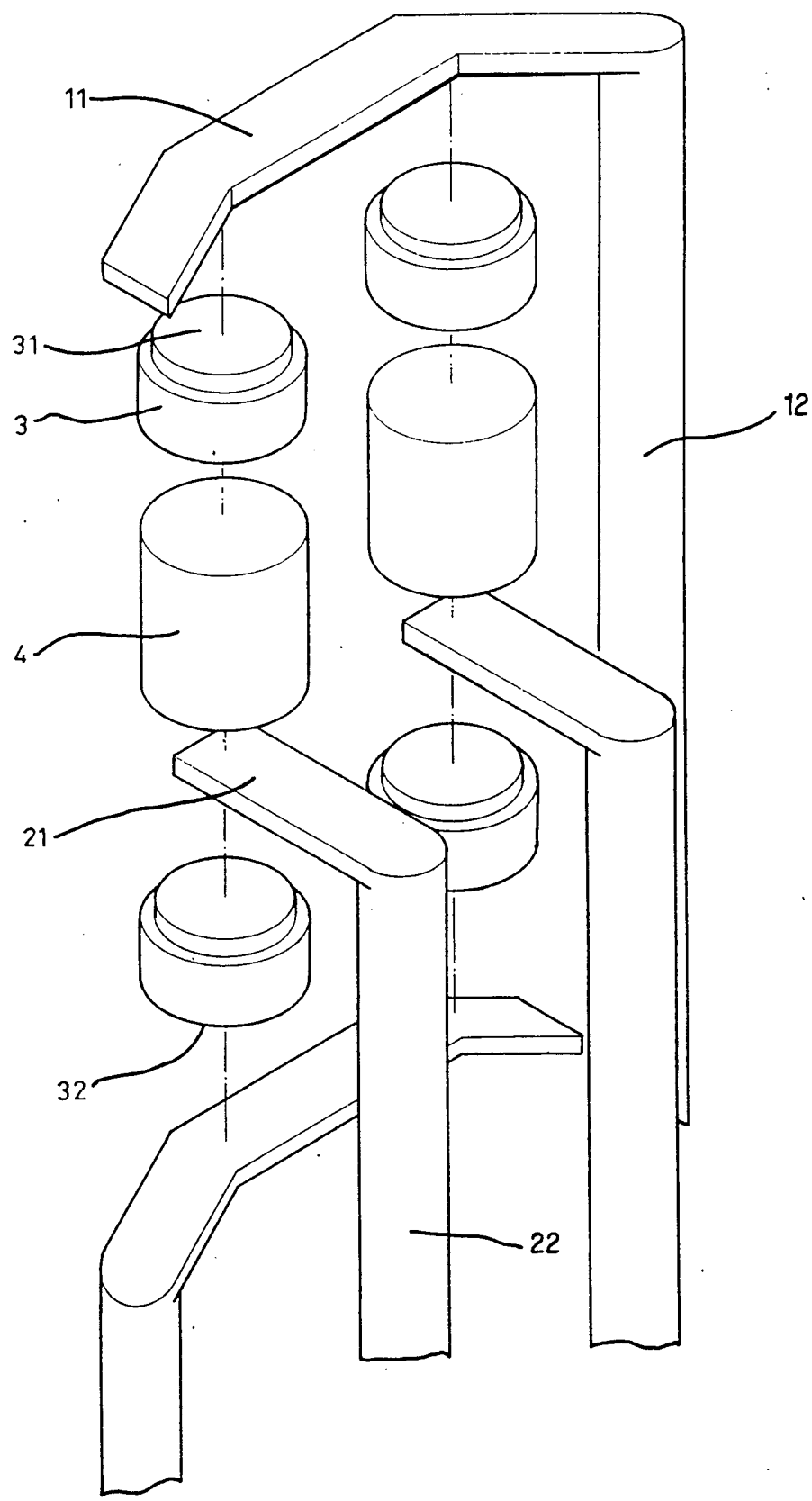
FIG. 2 is a perspective dismantled view of the preferred embodiment of the bridge rectifier of the present invention.
Figure 3:
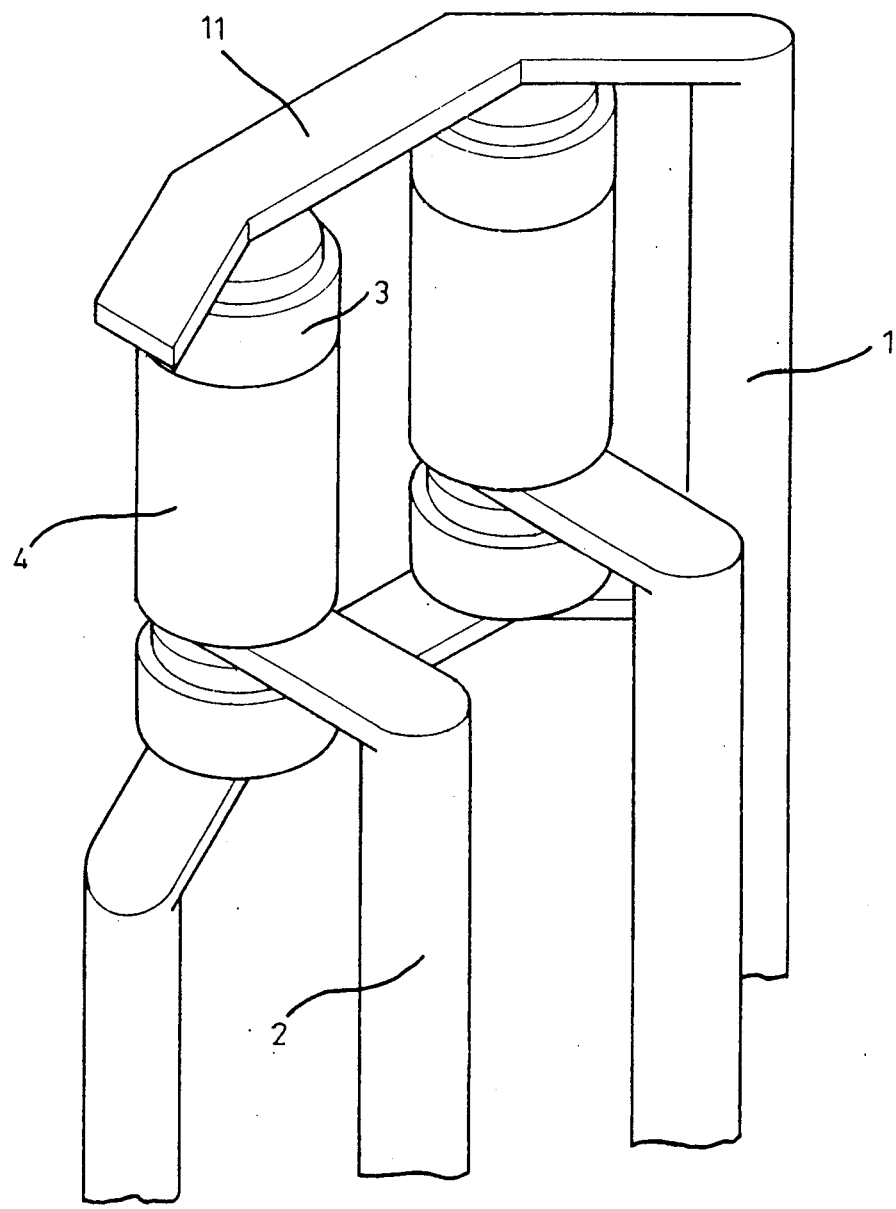
FIG. 3 is a perspective assembly view of the preferred embodiment of the bridge rectifier of the present invention.

Referring to FIGS. 2 and 3, therein illustrated is the preferred embodiment of the bridge rectifier of the present invention generally comprised of two outer leads 1, two inner leads 2, four silicon chips 3 and two conductive blocks 4. The outer leads 1 have each a curved silicon chip contact portion 11 at the front end, and a lead wire 12 vertically connected to said curved silicon chip contact portion 11. The inner leads 2 have each a silicon chip contact portion 21, and a lead wire 22 connected to said silicon chip contact portion 21 at the bottom, terminal end and arranged into a L-shaped configuration. The silicon chips 3 have each a positive pole 31 at one end and a negative pole at an opposite end 32. The conductive blocks 4 are each made of an electric conductor in cylindrical shape.

During assembly process, a first outer lead 1 is firstly set in the mold at a lower position and then fasten a first pair of silicon chips 3 thereto with the negative pole 32 of said first pair of silicon chips respectively soldered to the curved silicon contact portion 11 of said first outer lead 1 at the top. Then, insert two inner leads 2 in the mold with the silicon chip contact portion 21 thereof disposed above said first pair of silicon chips 3 and respectively connected to the positive pole 31 of said first pair of silicon chips 3 through soldering connection. Two conductive blocks 4 are then respectively soldered to the top edge of the silicon chip contact portion 21 of the first pair of silicon chips 3. Then, fasten a second pair of silicon chips 3 to said two conductive blocks 4 with the positive pole 32 thereof respectively soldered to the top edge of said two conductive blocks 4, i.e. the negative pole 31 of the second pair of silicon chips 3 is disposed at the top. At last, a second outer lead 1 is inserted in the mold with the bottom edge of the curved silicon chip contact portion 11 thereof soldered to the negative pole 31 of said second pair of silicon chips 3, permitting the lead wire 12 thereof to be guided out through an opposite side.

In the aforesaid process, all silicon chips 3 are inserted in the mold in the same direction, i.e. silicon chips 3 can be automatically continuously mounted in a plurality of molds through an automatic silicon chip mounting device to improve the productivity.

What is claimed is:

1. A bridge rectifier, comprising two outer leads, two inner leads, two pairs of silicon chips and two conductive blocks respectively connected into a rectifier circuit, wherein:

said outer leads have each a curved silicon chip contact portion at the front end, and a lead wire vertically connected to said curved silicon chip contact portion at one end;

said inner leads have each a silicon chip contact portion, and a lead wire connected to said silicon chip contact portion at the bottom end thereof and arranged into a L-shaped configuration;

said two pairs of silicon chips have each a positive pole at one end and a negative pole at an opposite end;

said conductive blocks are each made of an electric conductor in cylindrical shape; and characterized in that the assembly of the bridge rectifier is made by inserting a first outer lead in a mold and fastening a first pair of silicon chips to said first outer lead with the negative pole thereof respectively soldered to the top edge of the curved silicon contact portion of said first outer lead, then, inserting said two inner leads in said mold with the silicon chip contact portion thereof disposed above said first pair of silicon chips and respectively connected to the positive pole of said first pair of silicon chips through tin soldering connection, and then, connecting said two conductive blocks to the top edge of the silicon chip contact portion of said first pair of silicon chips through tin soldering process, and then, fastening a second pair of silicon chips to said two conductive blocks with the positive pole thereof respectively connected to the top edge of said two conductive blocks through tin soldering process permitting the negative pole thereof to be disposed upward, and at last, inserting a second outer lead in said mold with the bottom edge of the curved silicon chip contact portion thereof respectively connected to the negative pole of said second pair of silicon chips through tin soldering process permitting the lead wire thereof to be guided out through an opposite side.

* * * * *